United States Patent [19]

Giammanco

[11] Patent Number: 5,177,325
[45] Date of Patent: Jan. 5, 1993

[54] HOUSING FOR ELECTRIC TRANSFORMER

[75] Inventor: Angelo J. Giammanco, Palatka, Fla.

[73] Assignee: A. J. Giammanco & Associates, Inc., Palatka, Fla.

[21] Appl. No.: 453,672

[22] Filed: Dec. 20, 1989

[51] Int. Cl.⁵ .............................................. H05K 5/00
[52] U.S. Cl. ...................................... 174/50; 336/90; 336/92; 220/4.02; 174/52.1
[58] Field of Search ...................... 336/90, 92; 174/48, 174/50, 52.1, 65 R, 66, 67; 220/4.01, 4.02, 85 TC, 500, 521, 523

[56] References Cited

U.S. PATENT DOCUMENTS 2,740,905  4/1956  Henderson .
2,871,457  1/1959  Jencks et al. .
2,897,463  7/1959  Denham .
3,183,406  5/1965  Neydli .
3,360,752 12/1967  Uptegraff, Jr. .
3,365,535  1/1968  Wilk .
3,579,044  5/1971  Phillips .
3,681,663  8/1972  Albers .
3,760,314  9/1973  Krasienko et al. .

Primary Examiner—Leo P. Picard
Assistant Examiner—Bot Lee Ledynh
Attorney, Agent, or Firm—Arthur G. Yeager

[57] ABSTRACT

A box structure of a top, a back, a bottom, and two sides welded together to form an open front structure, and a two-piece front cover detachably attachable thereto; an interior horizontal wall welded in place to divide the interior space into a larger upper compartment to house the transformer, and a smaller lower compartment to house the wires connecting the transformer to a cable which has access to the lower compartment through a knock-out stamping in the bottom; two hanger strips attached to the top and the bottom, respectively, for attaching the box to a support; all of the seams for connecting the top and the bottom to the sides, the back, and the front cover being oriented such that water dripping over the outside of the box will be directed away from flowing to the inside of the box.

33 Claims, 5 Drawing Sheets

FIG I

HOUSING FOR ELECTRIC TRANSFORMER

BACKGROUND OF THE INVENTION

Electric transformers in electric power circuits are required to provide the necessary types of current for different usages by the consumer. In many cases, the transformer is a small rectangular device which must be located near residential homes and suspended outside on a pole carrying the power lines and able to withstand all of the atmospheric weather conditions. In the past, the typical transformer housing was a rectangular box with a hinged bottom cover which was openable to gain access to the transformer. Cables were attached through openings in the vertical sides of the housing making it inconvenient to repair the transformer and its leads when it was necessary to do so. Accordingly, there has been a need for a transformer housing box that provides better access to the transformer and its connecting conductors, as well as one that can withstand all weather conditions.

It is an object of this invention to provide an improved transformer housing. It is another object of this invention to provide an improved transformer housing that sheds rain without leading any of it inside the housing. It is still another object to provide an improved transformer housing having cable access passageways through the bottom. Still other objects will become apparent from the more detailed description which follows.

BRIEF SUMMARY OF THE INVENTION

This invention relates to a rectangular housing for an electric transformer comprising a top wall, a bottom wall, a back wall, and two side walls rigidly fastened to each other along the edges of the adjoining walls to form an open front box structure and a detachable front cover attached to the box structure, said adjoining edges being oriented such that rain dripping downwardly over the outside of the structure will not be directed to the interior of the structure, the interior space in the structure being divided by a horizontal wall into a larger upper space and a smaller lower space, and a knock-out stamping in said bottom to admit an electric cable into the housing through said bottom wall.

In specific and preferred embodiments of the invention the top wall and/or the bottom wall additionally include a means for attaching said housing to a support, preferably a vertical surface; the front cover is a two-piece subassembly which permits later access to the smaller lower space for maintenance purposes; and the top wall and the juncture between the two pieces of the front cover include a downwardly directed flange on the upper of any two adjoining walls to overlap the lower of those adjoining walls so as to prevent dripping water from entering inside of the housing.

BRIEF DESCRIPTION OF THE DRAWINGS

The novel features believed to be characteristic of this invention are set forth with particularity in the appended claims. The invention itself, however, both as to its organization and method of operation, together with further objects and advantages thereof, may best be understood by reference to the following description taken in connection with the accompanying drawings in which:

DETAILED DESCRIPTION OF THE INVENTION

Figure 1:
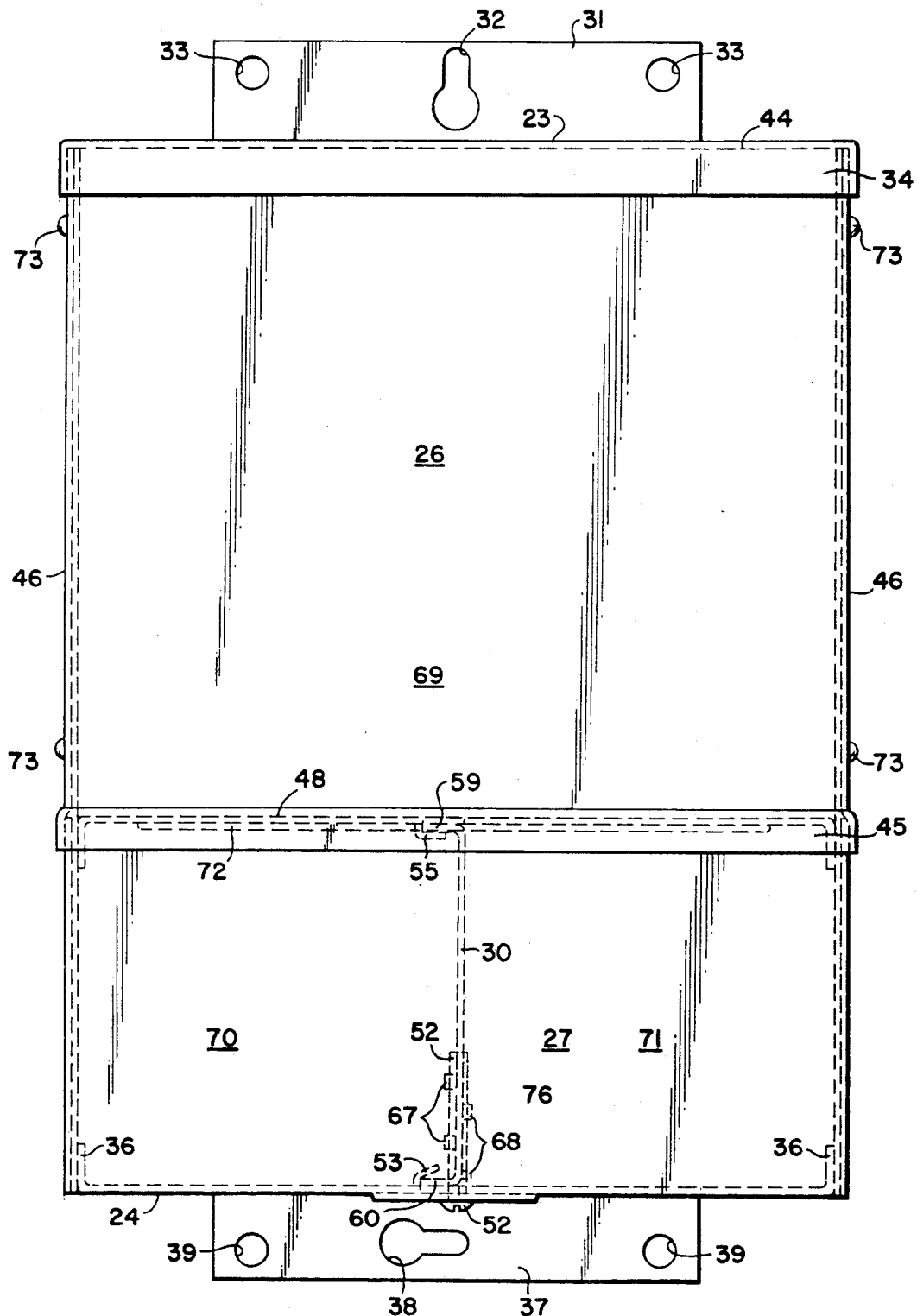
FIG. 1 is a front elevational view of the transformer housing of this invention.
Figure 2:
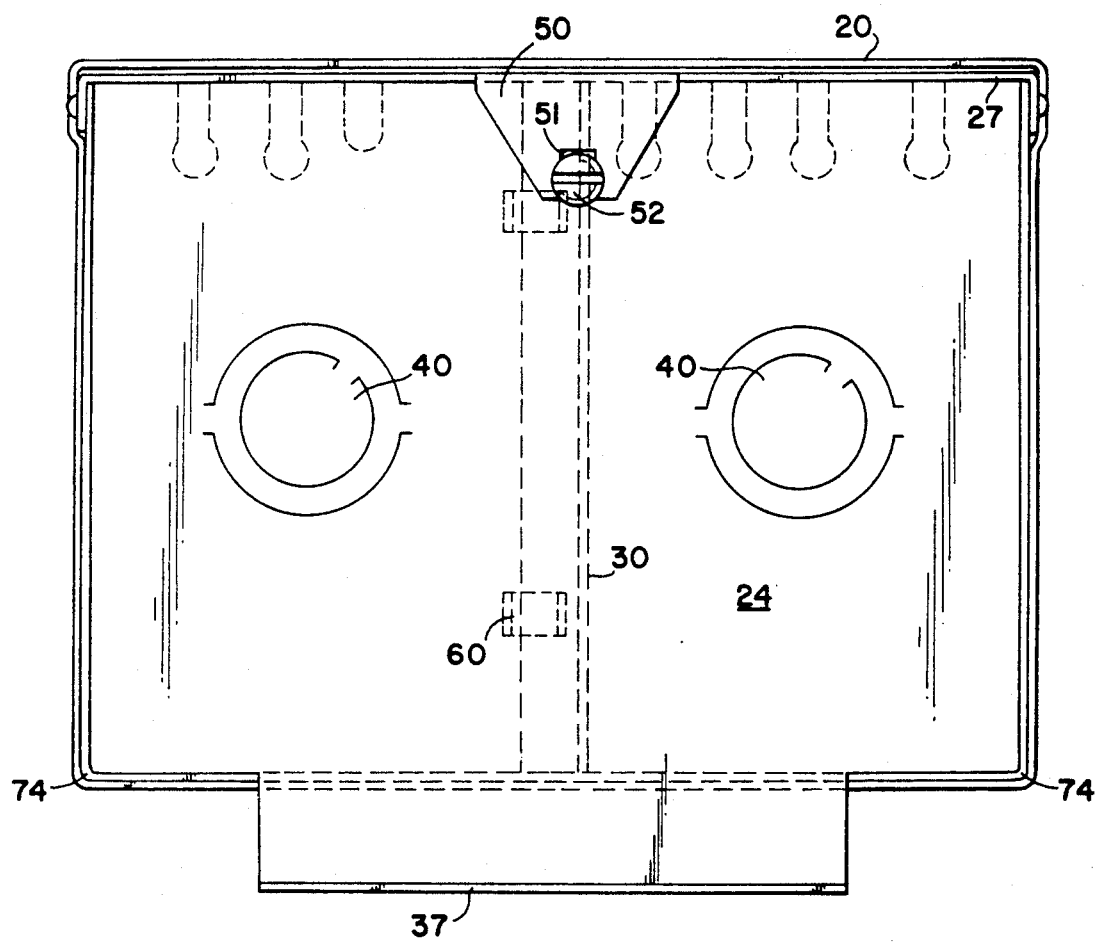
FIG. 2 is a bottom plan view of the housing of FIG. 1.
Figure 3:
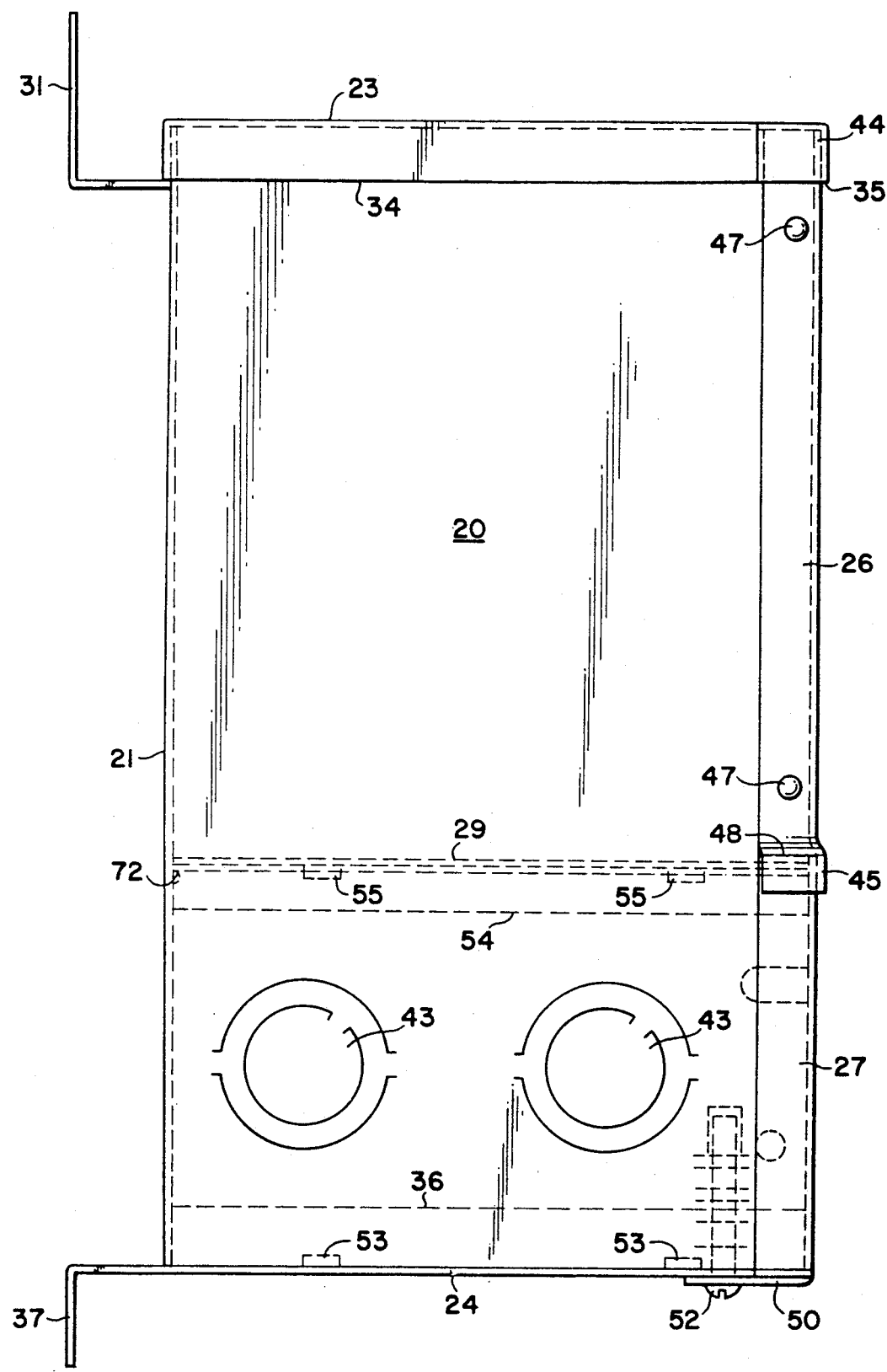
FIG. 3 is a side elevational view of the housing of FIGS. 1 and 2.

The features of the transformer housing of this invention may best be understood by reference to the attached drawings.

The housing of this invention is a rectangular box having an open front, a cover for the open front, and means for hanging the box on a vertical surface. The interior of the housing is divided into a large space for housing the transformer and two smaller spaces for arranging and containing the conductors that connect the transformer to inlet and outlet electric cables.

The housing includes a body 20 having rear wall 21 connected to two side walls 22. While body 20 can be assembled by fastening separate walls to each other, it is shown as a single integral sheet folded along two vertical fold lines. Top wall 23 and bottom wall 24 are fastened to the appropriate top and bottom edges of body 20 (as by welding) to make a rigid rectangular prismoidal box with an open front. Front cover 25 is made to fit over the open front and is fastenable to body 20 so as to totally enclose the interior rectangular prismoidal space, which, in turn, is divided into three compartments by divider structure 28 comprising horizontal wall 29 and vertical wall 30. The internal space, thus, comprises upper compartment 69 which is meant to house the transformer, and the lower compartments, left compartment 70 and right compartment 71 containing the electric wires running from outside cables to appropriate connection terminals on the transformer. Knock-out stampings 40 provide access passageways for connecting electric cables to the housing through bottom wall 24. There also are similar knock-out stampings in the lower positions of side walls 22 for connecting electric cables to compartments 70 and 71, in the event that it would be more convenient to bring the connection through a side wall 22 rather than through bottom wall 24. Generally, access through bottom wall 24 is preferable in order to eliminate the possibility of rain water running into compartments 70 and 71.

Top wall 23 is provided with a down turning flange 34 around all four edges thereof to provide an overlap at the connection between top wall 23 and rear wall 21 and side walls 22 for the same reason as mentioned above; namely, to eliminate the possibility of rain water running into the interior of the housing. Preferably, top wall 23 and its down turning flanges 34 are welded to side walls 22. Across the front flange 34 is flared outwardly to form a pocket 35 to receive the upper edge 44 of front wall 25. Top wall also contains a hanger flange 31 which is directed upwardly so as to lie against a vertical surface from which the housing might be suspended. Flange 31 contains a keyhole slot 32 and two other passageways 33 to provide optional means for attaching flange 31 to a supporting structure, e.g., by screws, bolts, hooks, nails, etc.

Bottom wall 24 is constructed somewhat similarly to top wall 23 in that it contains flanges 36 for connection to body 20 and a hanger flange 37 for attaching the housing to a vertical surface. Here, also, flange 37 has a keyhole slot 38 and two other passageways 39 for use in attaching housing to a support by means of screws, bolts, hooks, nails, etc. It is to be noted that attachment flanges 36 are bent upwardly on the inside of side walls 22 so that rain running down side walls 22 will not be directed inwardly to compartments 70 or 71. Preferably flanges 36 are welded to side walls 22.

Front cover 25 is preferably a two-piece member, including upper portion 26 and a lower portion 27, so that upper portion 26 may be fastened securely to side walls 22 to cover compartment 69 and the transformer contained therein, since once the transformer is placed therein, it is not anticipated that it will be necessary to perform maintenance service on it. Lower portion 27, however, is made to be easily removable so as to give access to compartments 70 and 71 to perform repair or maintenance on the connections to the transformer. Upper portion 26 has an upper edge 44 which slides under flange 34 and into pocket 35 to be wedged into a secure connection. Side flanges 46 overlap the outside of side walls 22. Holes 47 in side flanges 46 are aligned with holes 42 in side walls 22 to provide a passageway for a rivet, a screw, or a bolt-and-nut 73 to be employed in fastening upper portion 26 to body 20. Along the lower edge of portion 26 is a flange 45 flared outwardly similar to flange 34 at front 35 so as to make a pocket. Into this pocket of flange 45 the top edge 48 of lower portion 27 may be wedged to cause lower portion 27 to fit snugly against the open front of body 20. The vertical edges of lower portion 27 are bent to form side flanges 49 that fits snugly around the front edges of side walls 22. In this instance there are no aligned holes for rivets or screws or both. Lower portion 27 has a horizontal tab 50 which is bent to fit snugly against the outside of bottom wall 24. A slot 51 in tab 50 is aligned with a hole 75 through bottom wall 24 to permit a screw or bolt 52 to fasten tab 50 to bottom wall 24. Cooperating with screw or bolt 52 is a nut structure 76 in interior wall 30.

Figure 6:
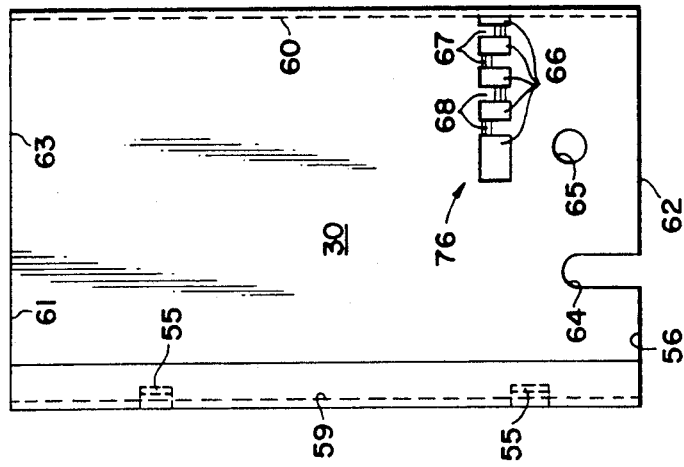
FIG. 6 is a side elevational view of the subassembly of FIG. 4 and 5.
Figure 4:
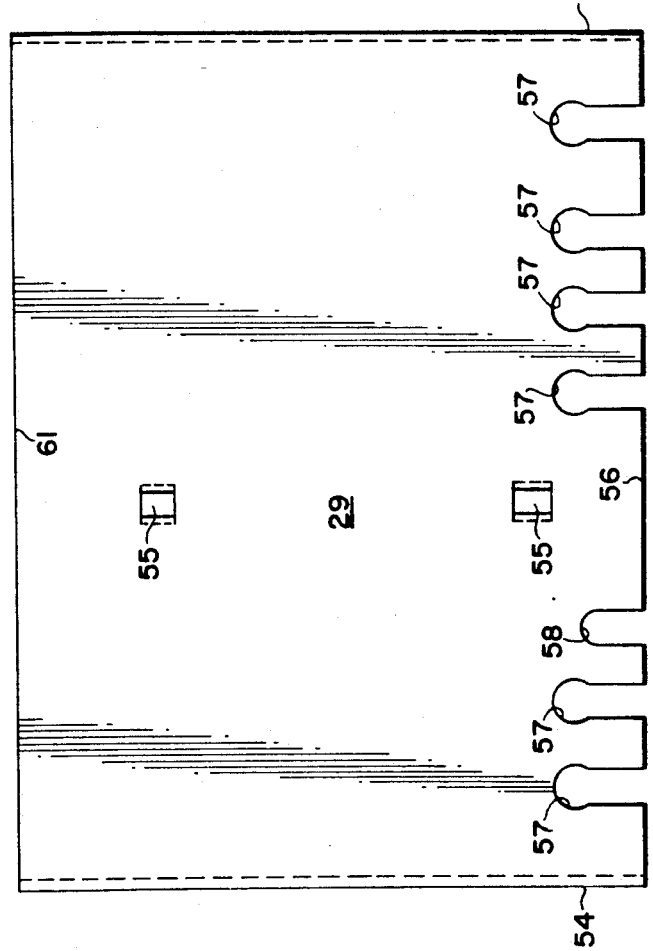
FIG. 4 is a top plan view of the divider wall subassembly of the housing of this invention.
Figure 5:
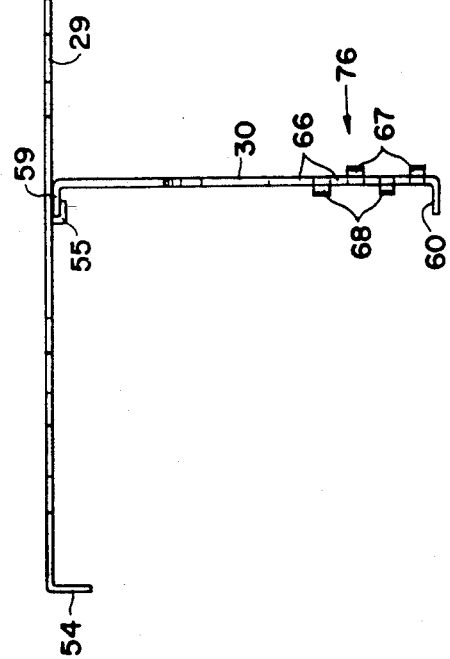
FIG. 5 is a front elevational view of the subassembly of FIG. 4.
Figure 7:
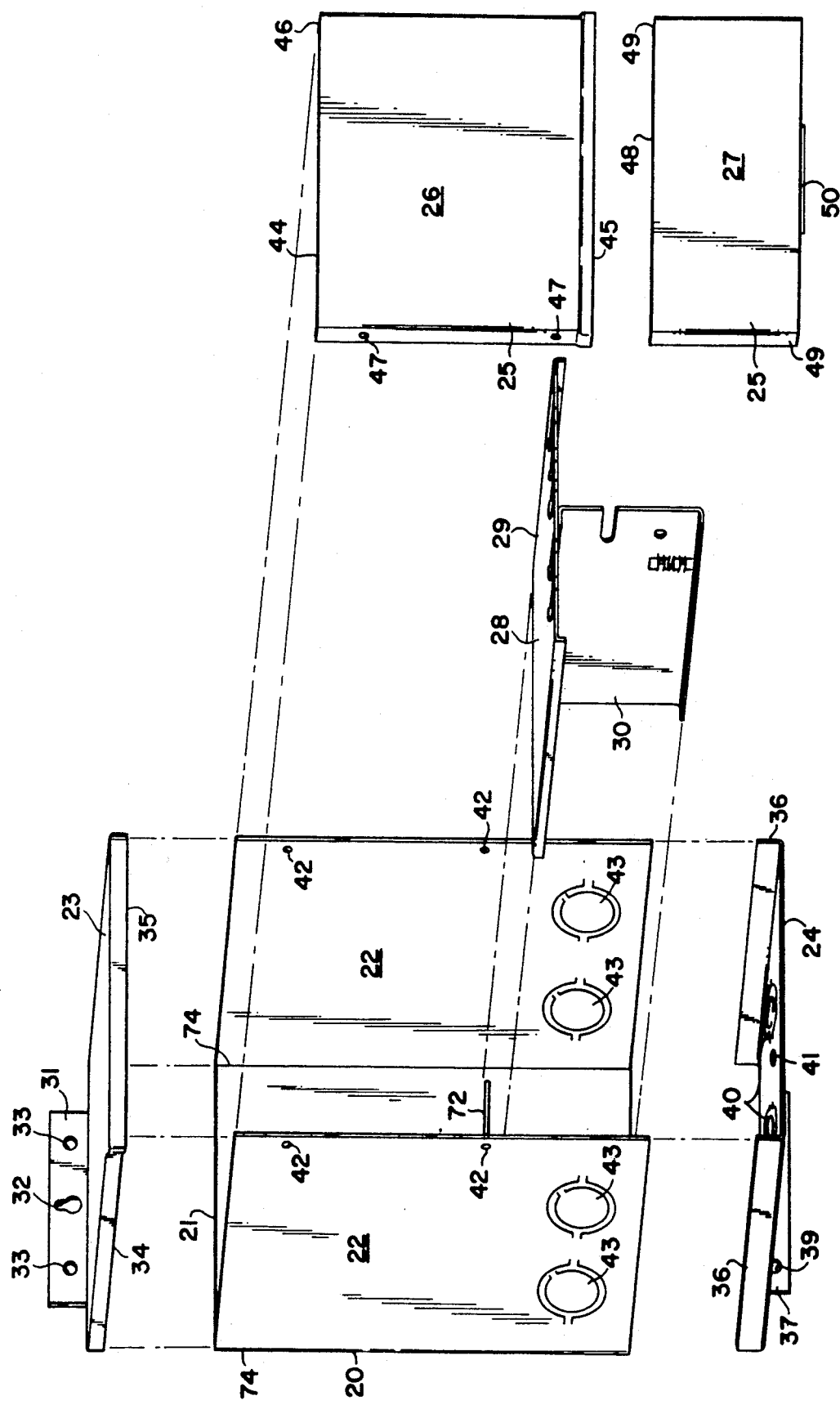
FIG. 7 is an exploded perspective view of the housing of this invention.

The interior space in the housing of this invention is divided into compartments as seen in FIGS. 4-6 where the structure comprises horizontal wall 28 and vertical wall 30. Tabs 55 are punched out of horizontal wall 29 and bent so as to engage upper flange 59 of vertical wall 30, and thereafter the juncture of wall 29 and flange 59 may be made rigid by spot welding along the puncture area. Side flanges 54 are bent downwardly so as to fit snugly against the inside of side walls 22, and then, preferably are spot welded in place. Similarly, lower flange 60 of vertical wall 30 is bent to fit snugly against the inside of bottom wall 24. Preferably bottom wall 24 has tabs 53 punched out and bent over flange 60 to position vertical wall 30 properly before spot welding flange 60 to bottom wall 24. Slots 57 and 58 are cut out from horizontal wall 29 to provide guides for positioning wire connections between the transformer in upper space 69 and the ends of electric cables in compartments 70 or 71. Slot 64 may also be provided in vertical wall 30 to assist in guiding the wires. A hole 65 is also provided in vertical wall 30 to receive a bolted terminal for a ground connection. There is, of course, nothing critical in the number, size, positioning, or spacing of the cut out slots, holes, etc. in vertical wall 30 or in horizontal wall 29. The exact configuration will depend on the transformer and its connections in the housing. Nut structure is shown as a plurality of cut out holes 66 separated by strips 67 and 68 which are bent outwardly to function as screw threads to receive screw 52. If the screw threads of strips 67 and 68 become loose they can be pinched together somewhat by pliers so as to provide a tighter fastening for screw 52. Knock-out stampings 40 in bottom wall 24 and 43 in side walls 22 are available to be punched out to make an access for an electric cable to be attached from the outside of the housing and to pass inwardly to compartments 70 or 71 as desired. Preferably knock-out stampings 40 are used to provide better protection against the entrance of rain water.

In rear wall 21 there is a horizontal bead 72 shown which projects into the inside of body 20 at the level of horizontal wall 29. This is to assist in providing a seal around horizontal wall 29 when the housing is assembled with the transformer in upper compartment 69. Frequently the transformer is then embedded in a protective plastic material or the like, by pouring the plastic in a molten form over the transformer and filling upper compartment 69. After the molten material solidifies, the transformer is protected from the weather, animals, pests, etc.

While the invention has been described with respect to certain specific embodiments, it will be appreciated that many modifications and changes may be made by those skilled in the art without departing from the spirit of the invention. It is intended, therefore, by the appended claims to cover all such modifications and changes as fall within the true spirit and scope of the invention.

What is claimed as new and what it is desired to secure by Letters Patent of the United States is:

1. An electrical transformer box comprising a rectangular structure totally enclosing an internal rectangular prismoidal space, said structure comprising a vertical rear wall, two vertical side walls, a vertical front wall, a horizontal top wall, and a horizontal bottom wall enclosing said internal space; said internal space being divided into one large and two small rectangular prismoidal compartments by an internal horizontal wall parallel to said top and said bottom walls and attached to said vertical side walls and said vertical rear wall, and an internal vertical wall perpendicular to and attached to said internal horizontal wall and said horizontal bottom wall; said horizontal top wall having four vertical flanges overlapping and bent downwardly to engage said four vertical walls adjacent said top wall and to be rigidly affixed thereto; said top wall having a vertical hang strip extending upwardly from said flange adjacent said rear wall and having means for hanging said box therefrom; said front wall being divided into an upper and a lower partial front wall which interleave with each other along respective joining edges adjacent said internal horizontal wall, said upper partial front wall being attachable to said vertical sidewalls by removable fastening means, said lower partial front wall having a horizontal tab extending rearwardly below said bottom wall and being attachable to said bottom wall by removable fastening means; each of said vertical side walls and said bottom wall having a knock-out opening into the adjacent one of said small rectangular prismoidal internal spaces to provide access for an electric conduit.

2. The box of claim 1 wherein said partial front walls are joinable along contiguous horizontal sections of each of said partial front walls wherein the upper partial front wall overlaps the outside of the lower partial front wall.

3. The box of claim 1 wherein said internal horizontal wall has a plurality of spaced U-shaped cut out slots along its edge which is adjacent said vertical front wall, said slots being of a size to permit electric conductors from a transformer to pass therethrough.

4. The box of claim 1 wherein said removable fastening means to join said upper partial front wall to said vertical side walls includes a plurality of screws.

5. The box of claim 1 wherein said removable fastening means to join said horizontal tab to said bottom wall includes aligned passageways to receive a threaded screw.

6. The box of claim 1 wherein said vertical hang strip attached to said top wall is offset to the rear of said rear wall and includes a passageway therethrough for attachment to a supporting threaded screw.

7. The box of claim 1 which additionally includes a vertical strip attached to said bottom wall and offset to the rear of said rear wall and including a passageway therethrough to receive a supporting threaded screw.

8. The box of claim 1 which includes in said vertical rear wall a horizontal bead extending inwardly of said rear wall and positioned supportingly for the edge of said internal horizontal wall that is adjacent said rear wall.

9. The box of claim 1 wherein said top wall, said bottom wall, said rear wall, said two vertical side walls, said internal horizontal wall and said internal vertical wall are welded to each other to form a rigid container with three internal compartment spaces.

10. The box of claim 9 wherein said upper partial front wall has an upper edge and a lower edge; said upper edge adjoining said vertical of said top wall by sliding a tongue under said flange, and said lower edge being flared outwardly to receive said lower partial front wall as a tongue sliding under said lower edge.

11. An electric transformer container box in the form of a rectangular prismoidal structure of a horizontal top wall, a vertical rear wall, a horizontal bottom wall and two vertical side walls welded together to form a box with an open front and with a downwardly extending flange from the four edges of said top wall adapted to contact and join the adjacent portions of said vertical walls, an internal horizontal wall welded to said vertical side walls and to said vertical rear wall dividing the internal space into an upper and a lower portion with said upper portion having about twice the volume of said lower portion; said lower portion being subdivided into two approximately equally sized spaces by an internal vertical wall welded perpendicular to said internal horizontal wall and to said bottom wall; a vertical front wall sized to close said open front and being divided into an upper and a lower partial front wall which are separable and joinable as desired; said upper partial front wall having an upper edge which joins said top wall by sliding under said flange, having a lower edge which is flared outwardly so to form a pocket, and having its two side edges bent so as to overlap an edge portion of said vertical side walls, said lower partial front wall having an upper edge which is slidable into said pocket, having a lower edge from which extends a horizontal tab to overlap a portion of said bottom wall, and having its two side edges bent so as to overlap an edge portion of said vertical side walls, aligned passageways through said bent edges of said upper partial front wall and said vertical side walls to receive fastened therethrough for rigidly attaching said upper partial front wall to said box, and an aligned passageway through said tab and said bottom wall to receive a fastener therethrough for rigidly attaching said lower partial front wall to said box, a first vertical support strip rigidly attached to said top wall and having at least one passageway therethrough to receive a supporting fastener; and a second vertical support strip rigidly attached to said bottom wall and having at least one passageway therethrough to receive a supporting fastener; said vertical side walls, and said bottom wall having a plurality of knock-out portions to receive electric cables therethrough, there being at least one knock-out portion to communicate each of said internal subdivisional spaces with the outside of said box through said bottom wall and through said respective vertical side wall.

12. The box of claim 11 wherein said internal horizontal wall has a front edge adjacent said open front, said front edge containing a plurality of spaced cut-out U-shaped slots as guideways for an electrical conductor to pass thereby.

13. The box of claim 11 wherein said rear wall contains a horizontal bead along its surface facing said internal space, and being positioned to support said internal horizontal wall along its edge adjacent said rear wall.

14. The box of claim 11 wherein said internal vertical wall includes a tubular recess to receive the shank of a threaded screw through said passageway in said tab.

15. The box of claim 11 wherein said passageway in said tab is a U-shaped slot.

16. A rectangular housing for an electric transformer comprising a top wall, a bottom wall, a back wall, and two side walls rigidly fastened to each other along edges of said walls to form an open front box structure, an upper front wall having a lower edge and being attached to said side walls and a detachable lower front cover having an upper edge and being attached to said box structure, said upper edge being oriented beneath said lower edge such that rain dripping downwardly over the outside of said housing will be directed away from the interior of said housing, the interior space of said structure being divided by a horizontal wall into a larger upper space to receive a transformer and a smaller lower space, and a pair of knock-out stampings in said bottom wall to admit electric conduits into said structure through said bottom wall for connection to transformer conduits therein.

17. The housing of claim 16 wherein said top wall includes a hanger for attaching said box to a supporting member.

18. The housing of claim 17 wherein said bottom wall includes a hanger for attaching said box to a supporting member.

19. The housing of claim 18 wherein said top wall includes a downwardly directed flange portion across said open front to form a pocket to receive therein an upper edge of said upper front wall when said upper front wall is attached to said housing.

20. The housing of claim 19 wherein said upper front wall includes a lower flange portion spaced outwardly and extending across said open front to form a pocket to receive therein upper edge of said lower front cover when said lower front cover is attached to said bottom wall.

21. An electrical transformer box comprising a main body portion including a vertical rear wall having vertical edges and a pair of opposed and spaced vertical side walls affixed along said vertical edges of said rear wall, a front wall upper portion substantially parallel to and spaced from said rear wall and being connected to each of said side walls, a rectangular top wall having four interconnected vertical flanges forming a cap and being respectively positioned outwardly of and overlapping an upper edge of each said side and rear walls and front wall upper portion, a bottom wall affixed to said vertical side walls and said rear wall and having a pair of spaced knock-out openings to provide access for electric conduits, a front wall lower portion having a horizontal tab extending to and adjacent said bottom wall, selectively removable fastening means for connecting said tab to said bottom wall, said front wall upper portion having a lower edge, said lower portion having an upper edge, said upper edge of said lower portion being located rearwardly of and above said lower edge when said tab is connected to said bottom wall.

22. The box of claim 21 wherein said lower edge of said front wall upper portion is offset forwardly of a plane defined by said front wall upper and lower portions.

23. The box of claim 22 wherein said front wall upper portion includes a pair of side flanges which are respectively positioned outwardly of and overlapping a forward edge of respective side wall.

24. The box of claim 23 wherein said front wall lower portion includes a pair of side flanges which are respectively positioned outwardly of and overlapping respective said forward edge.

25. The box of claim 21 wherein each of said vertical side walls adjacent said bottom wall includes a knock-out opening.

26. The box of claim 21 further comprising a horizontal divide wall spaced parallel and remote to said top wall and parallel and adjacent said bottom wall, said upper edge of said lower wall portion being located substantially along and in alignment with said divider wall so as to substantially fully expose the interior of the box below said divider wall when said lower wall portion is removed.

27. The box of claim 26 further comprising a vertical divider wall attached substantially midway between said horizontal divider wall and said bottom and being substantially parallel to said side walls to form substantially equal compartments for making connections between a transformer disposable above said horizontal divider wall and electric conduit entering into said compartments.

28. The box of claim 27 wherein each of said vertical side walls adjacent said bottom wall includes a knock-out opening, said selectively releaseable means including a plurality of alternating straps struck from said vertical divider wall to form a seat and a threaded member passing through said tab and an opening in said bottom wall which is aligned with said seat, said threaded member being engaged with facing surfaces of said straps.

29. The box of claim 21 wherein said top wall includes a top extension of said flange adjacent said rear wall, said top extension having a first portion extending generally horizontally rearwardly and thence upwardly and having a free end portion above said first portion thereof, said free end portion including means to attach said box to a supporting structure.

30. The box of claim 29 wherein said bottom wall includes a bottom extension connected to an edge adjacent said rear wall, said bottom extension having a first portion extending rearwardly in a generally horizontal place with said bottom wall and downwardly and having a free end portion below said first portion thereof, said free end portion of said bottom extension including another means to attach said box to a supporting structure.

31. The box of claim 21 wherein said rear wall and side walls are unitary and said top wall and bottom wall are integrally affixed, said box further including a horizontal divider integrally affixed to said side walls remotely of said top wall and spaced adjacently above said bottom wall, a vertical divider integrally affixed to each of said horizontal divider and said bottom to form substantially equal compartments for making connections between electric conduits entering into said compartments and a transformer disposable in said box above said horizontal divider.

32. The box of claim 31 wherein each said side wall adjacent said bottom includes a knock-out opening to provide access for an electric conduit.

33. The box of claim 32 wherein said horizontal divider wall includes openings for receiving therethrough connections from a transformer locatable above said horizontal divider wall.

* * * * *